(12) United States Patent
Hirose et al.

(10) Patent No.: US 11,569,073 B2
(45) Date of Patent: Jan. 31, 2023

(54) ASSEMBLY PROVIDED WITH COOLANT FLOW CHANNEL, METHOD OF CONTROLLING ASSEMBLY PROVIDED WITH COOLANT FLOW CHANNEL, AND SUBSTRATE PROCESSING APPARATUS

(71) Applicant: Tokyo Electron Limited, Tokyo (JP)

(72) Inventors: Jun Hirose, Miyagi (JP); Kaoru Oohashi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 670 days.

(21) Appl. No.: 16/110,201

(22) Filed: Aug. 23, 2018

(65) Prior Publication Data

US 2019/0066985 A1 Feb. 28, 2019

(30) Foreign Application Priority Data

Aug. 25, 2017 (JP) .............................. JP2017-162695

(51) Int. Cl.
*H01J 37/32* (2006.01)
*H01L 21/683* (2006.01)
*H01L 21/687* (2006.01)
*H01L 21/67* (2006.01)

(52) U.S. Cl.
CPC .. *H01J 37/32724* (2013.01); *H01J 37/32715* (2013.01); *H01J 37/32733* (2013.01); *H01L 21/67109* (2013.01); *H01L 21/6831* (2013.01); *H01L 21/6833* (2013.01); *H01L 21/68742* (2013.01); *H01J 2237/002* (2013.01); *H01J 2237/332* (2013.01); *H01J 2237/334* (2013.01); *H01L 21/67103* (2013.01)

(58) Field of Classification Search
CPC ............. H01L 21/67; H01L 21/67017; H01L 21/67109; H01L 22/12; H01L 21/67288; H01L 21/68785; H01L 21/6833; H01L 21/6831; H01J 37/32724; H01J 2237/2001; H01J 2237/2002; C23C 16/45521; C23C 16/46; C23C 16/463; C23C 16/466

See application file for complete search history.

(56) References Cited

U.S. PATENT DOCUMENTS

| | | |
|---|---|---|
| 2003/0159307 A1 | 8/2003 | Sago et al. |
| 2009/0197418 A1 | 8/2009 | Sago et al. |
| 2009/0233443 A1 | 9/2009 | Sasaki |
| 2014/0008020 A1* | 1/2014 | Nagayama ........ H01J 37/32724 137/2 |
| 2014/0076515 A1 | 3/2014 | Sasaki |
| 2015/0187625 A1* | 7/2015 | Busche .............. H05K 7/20218 361/234 |

FOREIGN PATENT DOCUMENTS

| | | | |
|---|---|---|---|
| CN | 1441083 | 9/2003 | |
| CN | 101383314 | 3/2009 | |
| JP | 2008-085329 | 4/2008 | |
| JP | 2014-011382 | 1/2014 | |
| JP | 2015-144242 | 8/2015 | |
| JP | 2016-174060 | 9/2016 | |
| KR | 100532322 B1 * | 11/2005 | ....... H01L 21/67109 |

* cited by examiner

*Primary Examiner* — John J Norton
*Assistant Examiner* — Simpson A Chen
(74) *Attorney, Agent, or Firm* — IPUSA, PLLC

(57) ABSTRACT

An assembly provided with a coolant flow channel includes a base in which the coolant flow channel is formed; and a protrusion component that is disposed in the coolant flow channel, wherein the protrusion component is liftable or rotatable.

10 Claims, 5 Drawing Sheets

FIG.5

```
START
  ↓
S10: SUPPLY COOLANT AT PREDETERMINED TEMPERATURE FROM A CHILLER UNIT TO A FLOW CHANNEL FOR THE COOLANT
  ↓
S12: SUPPLY PREDETERMINED ELECTRIC POWER TO HEATER
  ↓
S14: VERTICALLY MOVE A SCREW DISPOSED IN THE FLOW CHANNEL FOR THE COOLANT IN RESPONSE TO THE ELECTRIC POWER SUPPLIED TO THE HEATER
  ↓
END
```

FIG.6

| ELECTRIC POWER SUPPLIED TO HEATER | HEIGHT OF SCREW |
|---|---|
| Pa | ha |
| Pb | hb |
| Pc | hc |
| ⋮ | ⋮ |

ASSEMBLY PROVIDED WITH COOLANT FLOW CHANNEL, METHOD OF CONTROLLING ASSEMBLY PROVIDED WITH COOLANT FLOW CHANNEL, AND SUBSTRATE PROCESSING APPARATUS

CROSS-REFERENCE TO RELATED APPLICATION

The present application is based upon and claims the benefit of priority to Japanese Patent Application No. 2017-162695, filed on Aug. 25, 2017, the entire contents of which are incorporated herein by reference.

BACKGROUND OF THE INVENTION

1. Field of the Invention

The present invention relates to an assembly provided with a coolant flow channel, a method of controlling an assembly provided with a coolant flow channel, and a substrate processing apparatus.

2. Description of the Related Art

In order to adjust a temperature of a wafer, it has been proposed to provide a flow channel for flowing coolant inside a mounting table, or to embed a heater inside the mounting table. For example, Patent Document 1 (Japanese Unexamined Patent Publication No. 2008-85329) proposes to enhance in-plane uniformity of a temperature distribution on a surface of a wafer by separately providing a peripheral flow channel for cooling a periphery of a mounting table, in addition to a flow channel for cooling the entire mounting table, to enhance a heat dissipation property at an edge of the wafer. Additionally, by optimizing a pattern of a heater, in-plane uniformity of a temperature distribution on a surface of a wafer can be enhanced.

In the above-described methods, however, a design change is required, such as providing a peripheral flow channel or optimizing a pattern of a heater. Accordingly, for example, at a singular point of the temperature distribution at which a heat dissipation amount rapidly changes, it may not be possible to make a correction for achieving uniformity of the temperature of the wafer without redesigning.

There is a need for a technique with which uniformity of a temperature of a substrate can be achieved without redesigning a mounting table.

SUMMARY OF THE INVENTION

According to an aspect of the present invention, there is provided an assembly provided with a coolant flow channel, the assembly including a base in which the coolant flow channel is formed; and a protrusion component that is disposed in the coolant flow channel, wherein the protrusion component is liftable or rotatable.

According to an embodiment of the present invention, a technique can be provided with which uniformity of a temperature of a substrate can be achieved without redesigning a mounting table.

Other objects, features and advantages of the present invention will become more apparent from the following detailed description when read in conjunction with the accompanying drawings.

BRIEF DESCRIPTION OF THE DRAWINGS

FIG. 5 is a flowchart illustrating an example of a control process of an assembly including the coolant flow channel according to an embodiment; and FIG. 6 is diagram illustrating an example of a table used for the control process of the assembly including the coolant flow channel according to an embodiment.

DESCRIPTION OF THE PREFERRED EMBODIMENTS

Figure 1:
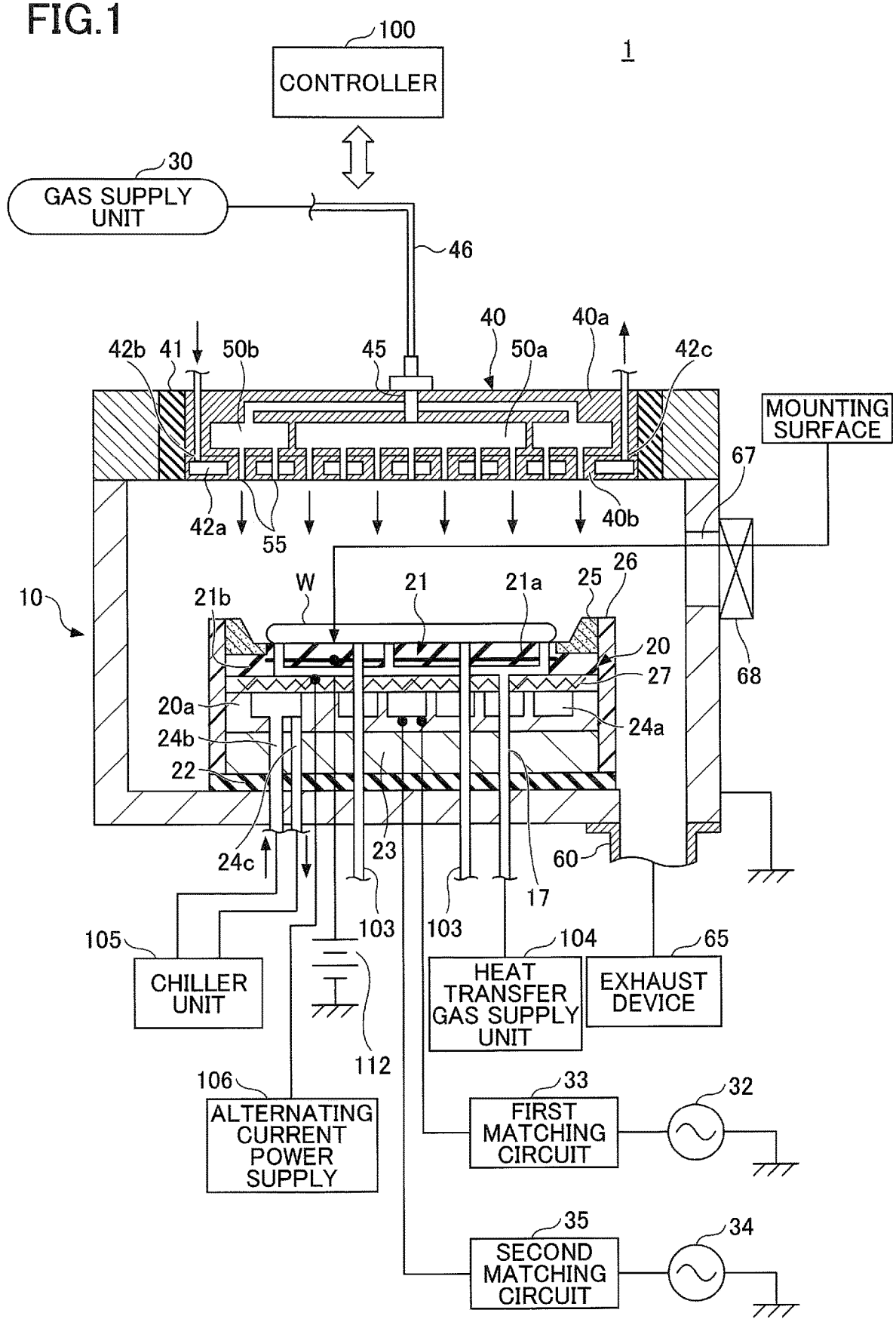
FIG. 1 is a diagram illustrating an example of a substrate processing apparatus according to an embodiment.

In the following, an embodiment of the present invention is described by referring to the drawings. Note that, in the specification and the drawings, duplicate descriptions are omitted by attaching identical reference numerals to substantially the same configurations.

[Overall Configuration of the Substrate Processing Apparatus]

First, an example of a substrate processing apparatus 1 is described by referring to FIG. 1. FIG. 1 illustrates the example of the substrate processing apparatus 1 according to an embodiment. The substrate processing apparatus 1 according to the embodiment is a capacitively coupled parallel plate substrate processing apparatus, and the substrate processing apparatus 1 includes a processing container 10 having an approximately cylindrical shape. Alumite treatment (anodic oxidation treatment) has been applied to an inner surface of the processing container 10. An inner part of the processing container 10 is a processing chamber for executing a plasma etching process or a plasma process, such as a film forming process.

The mounting table 20 is for mounting a semiconductor wafer W (which is simply referred to as the wafer W, hereinafter), which is an example of a substrate. The mounting table 20 includes a base 20a and an electrostatic chuck 21. The electrostatic chuck 21 has a structure such that an attraction electrode 21a is interposed between insulators 21b. A direct-current power supply 112 is connected to the attraction electrode 21a. Upon a direct-current voltage is applied from the direct-current power supply 112 to the attraction electrode 21a, the wafer W is electrostatically attracted to the electrostatic chuck 21.

The base 20a is formed of an electrically conductive metal, such as aluminum (Al), titanium (Ti), or silicon carbide (SiC). The base 20a functions as a lower electrode. Inside the base 20a, a flow channel 24a for coolant is formed. Additionally, in the base 20a, a heater 27 is embedded at an upper position of the flow channel 24a for the coolant.

The base 20a is supported by a conductor support base 23. The base 20a is disposed in the processing container 10 through an insulating plate 22. A chiller unit 105 is connected to the flow channel 24a for the coolant through a coolant inlet pipe 24b and a coolant outlet pipe 24c.

A temperature of the coolant, such as cooling water, is controlled to be a set temperature by the chiller unit 105. After outputting from the chiller unit 105, the coolant enters the flow channel 24a for the coolant from the coolant inlet pipe 24b. After flowing through the flow channel 24a in the base 20a, the coolant exits from the coolant outlet pipe 24c to return to the chiller unit 105. As described above, the mounting table 20 is cooled by the coolant circulating inside the mounting table 20. Additionally, the mounting table 20 is heated as power is supplied to the heater 27 from an alternating current power supply 106, and the temperature of the mounting table 20 is controlled to be a predetermined set temperature. As described above, by controlling the temperature of the mounting table 20 to be the predetermined temperature, the temperature of the wafer W is controlled to be the predetermined temperature. Note that the heater 27 is an example of a heating component. The heating component is not limited to the heater 27. The heating component may be heating wire embedded in the base 20a, or may be sheet shaped heating wire attached to the base 20a. The heater 27 may not be provided.

At an upper part of the outer periphery side of the mounting table 20, a focus ring 25 is provided, which is formed of a single crystal silicon, for example, so as to surround the waver W. Additionally, a cylindrical insulator ring 26 formed of, for example, quartz is provided to surround the outer circumference of the base 20a, the electrostatic chuck 21, and the focus ring 25.

A first RF power supply 32 is connected to the base 20a through a first matching circuit 33. Additionally, a second RF power supply 34 is connected to the base 20a through a second matching circuit 35. High frequency power is supplied to the base 20a from the first RF power supply 32 to generate plasma with a predetermined frequency. Further, high frequency power with a frequency that is lower than the frequency of the high frequency power output from the first RF power supply 32 is supplied to the base 20a from the second RF power supply 34. The high frequency power supplied to the base 20a from the second RF power supply 34 is high frequency power for ion attraction (for bias).

A gas supply pipe 17 for supplying a heat transfer gas (a backside gas), such as helium gas, is provided on the rear surface of the wafer W. A heat transfer gas supply unit 104 is connected to the gas supply pipe 17. The heat transfer gas is supplied from the heat transfer gas supply unit 104, and the heat transfer gas is supplied between the rear surface of the wafer W and the surface of the electrostatic chuck 21 through the gas supply pipe 17.

A plurality of lift pins 103 are provided in the mounting table 20. For example, three lift pins 103 are provided in the mounting table 103. In FIG. 1, only two lift pins 103 are depicted. The lift pins 103 are driven by a motor, etc., to move vertically during loading and unloading of the wafer W. The lift pins 103 can be used to place the wafer W on the mounting table 20. The lift pins 103 can be used to remove the wafer W from the mounting table.

At an upper side of the mounting table 20, a gas shower head 40, which functions as an upper electrode, is provided to face the mounting table 20 in parallel. Namely, the gas shower head 40 and the mounting table 20 function as a pair of electrodes (the upper electrode and the lower electrode). Note that the high frequency power for generating plasma that is output from the first RF power supply 32 may be applied to the gas shower head 40.

The gas shower head 40 is provided with a main body 40a and a top plate 40b. The gas shower head 40 is provided at a ceiling wall part of the processing container 10. The gas shower head 40 is supported by the processing container 10 through an insulating member 41. The main body 40a is formed of an electrically conductive material, such as aluminum with a surface to which anodic oxidation treatment has been applied. The main body 40a is configured so that the top plate 40b can be detachably supported at the lower part of the main body 40a.

Inside the main body 40a, a gas diffusion chamber 50a at the center side and a gas diffusion chamber 50b at the outer circumference side are provided. Multiple gas holes 55 that open toward the processing container 10 are formed in the top plate 40b at the lower pats of the gas diffusion chambers 50a and 50b.

A gas introduction port 45 for introducing the processing gas into the gas diffusion chambers 50a and 50b is formed in the main body 40a. A gas supply pipe 46 is connected to the gas introduction port 45, and a gas supply unit 30 is connected to the gas supply pipe 46. From the gas supply unit 30, a predetermined processing gas, such a gas used for plasma etching, is supplied to the gas diffusion chambers 50a and 50b through the gas supply pipe 46. The processing gas diffused in the gas diffusion chambers 50a and 50b is supplied to the processing container 10 through the gas holes 55 while diffused in a shower shape.

Inside the top plate 40b, a flow channel 42a for the coolant is formed. A chiller unit is connected to the flow channel 42a for the coolant through a coolant inlet pipe 42b and a coolant outlet pipe 42c, which pass through the main body 40a. The chiller unit connected to the flow channel 42a for the coolant may be the chiller unit 105 or another chiller unit.

The coolant, which is controlled to be the set temperature, outputs from the chiller unit and enters the flow channel 42a for the coolant from the coolant inlet pipe 42b. After flowing through the flow channel 42a inside the top plate 40b, the coolant exits from the coolant outlet pipe 42c to return to the chiller unit. As described above, the temperature of the upper electrode 40 is controlled to be a predetermined temperature by the coolant circulating inside the upper electrode 40.

An exhaust pipe 60 is formed at the bottom of the processing container 10, and the processing container 10 is connected to an exhaust device 65 through the exhaust pipe 60. The exhaust device 65 is provided with a vacuum pump, and by operating this vacuum pump, the pressure inside the processing container is reduced to be a predetermined degree of vacuum. In the side wall of the processing container, a loading/unloading port 67 for the wafer W is formed. A gate valve 69 for opening and closing the loading/unloading port 67 is provided at the loading/unloading port 67.

A controller 100 controls the operation of the substrate processing apparatus 1. The controller 100 is provided with a central processing unit (CPU), a memory, and a user interface. The user interface is formed of a keyboard, a display, etc. The keyboard is used for performing an operation to input a command for a process administrator to manage the substrate processing apparatus 1. The display is for visualizing and displaying an operating status of the substrate processing apparatus.

A recipe is stored in the memory. The recipe stores a control program (software) and processing condition data, etc., to be implemented under control of the CPU. A recipe, such as the control program and the processing condition data, may be stored in a computer readable computer storage medium (e.g., a hard disk, a CD, a flexible disk, a semiconductor memory), and the recipe that is stored in the computer storage medium may be used. A recipe, such as the control program and the processing condition data, may be transmitted from another device at any time, for example, through a dedicated line, and the recipe may be used online.

During loading of the wafer W, the gate valve 68 is opened. When the wafer W is carried into the processing container 10 through the loading/unloading port 67, the lift pins 103 are raised. Then, the wafer W is passed from the arm to the lift pins 103, and the wafer W is supported by the lift pins 103. The lift pins 103 move vertically by driving of the motor, etc. When the lift pins 103 moves downward and the wafer W is mounted on the mounting table 20, a direct current voltage is applied from the direct-current power source 112 to the attraction electrode 21a, and the wafer W is attracted and supported by the electrostatic chuck 21.

The processing gas is supplied from the gas supply unit 30 into the processing container 10. The high frequency power for generating plasma is applied from the first RF power source 32 to the mounting table 20, and the high frequency power for attracting ions is applied from the second RF power supply 34 to the mounting table 20. As a result, a predetermined plasma process is applied to the wafer W by the action of the plasma generated above the wafer W and the attraction of ions.

After the plasma processing, the application of the direct current voltage from the direct-current power source 112 to the attraction electrode 21a is terminated, and, by supplying a heat transfer gas to a gap between the wafer W and the electrostatic chuck 21, discharging is performed. After discharging, the wafer W is removed from the electrostatic chuck 21, and the wafer W is passed to the arm in a state in which the wafer W is supported by the lift pins 103 by lifting of the lift pins 103. Then, the wafer W is taken out from the loading/unloading port 67.

[Flow Channel for the Coolant/Protrusion Component (the Case of Screw)]

Figure 2:
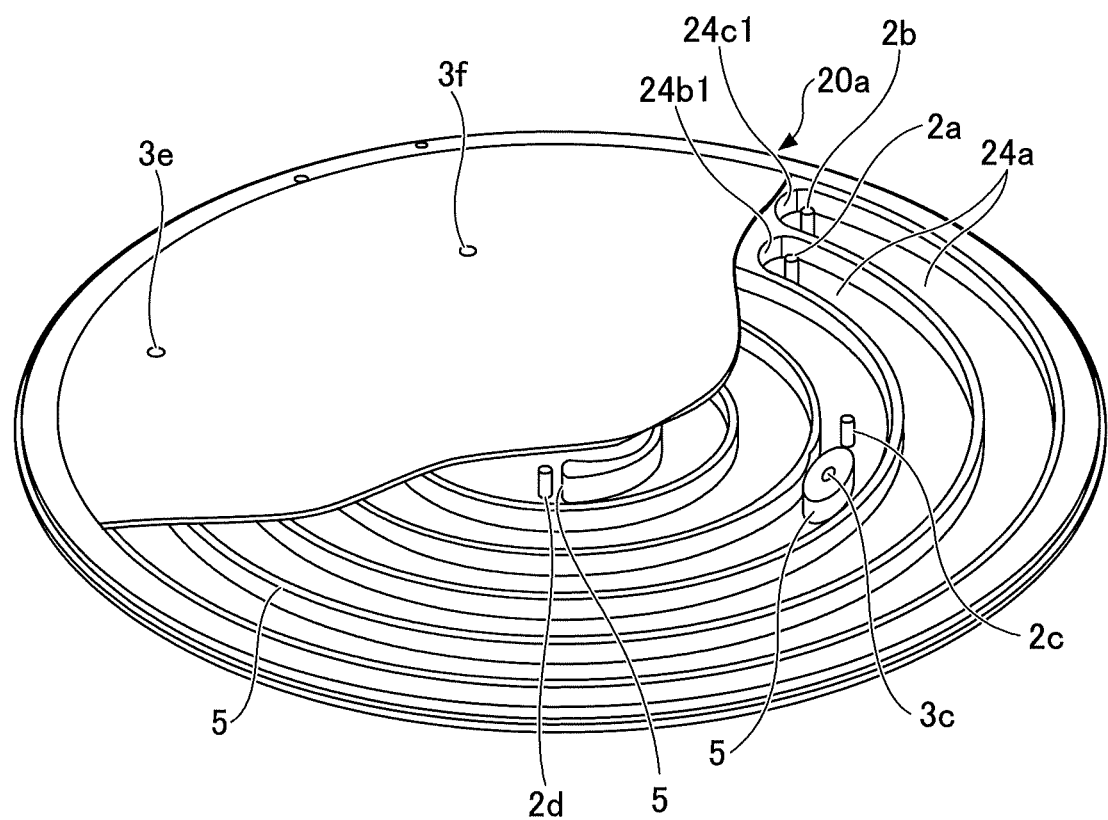
FIG. 2 is a perspective view illustrating an example of a coolant flow channel formed in a mounting table according to an embodiment.

Next, an example of the flow channel 24a for the coolant formed in the mounting table 20 and an example of a protrusion component are described by referring to FIG. 2. FIG. 2 is a perspective view illustrating the example of the flow channel 24a for the coolant formed in the mounting table 20 according to an embodiment. In FIG. 2, a screw is illustrated as an example of the protrusion component.

The flow channel 24a for the coolant illustrated in FIG. 2 is formed in the base 20a. The flow channel 24a for the coolant according to the embodiment is formed to have a spiral shape. At the end parts, an inlet hole 24b1 connected to the coolant inlet pipe 24b and an outlet hole 24c1 connected to the coolant outlet pipe 24c are formed. The coolant supplied from the chiller unit 105 enters the inlet hole 24b1. Then, the coolant flows inward in the spiral flow channel 24a in a clockwise direction. The coolant changes the flow direction at the central portion, and the coolant flows outward in the spiral flow channel 24a in the counterclockwise direction to exit from the outlet hole 24c1.

There is a singular point of a temperature distribution in the flow channel 24a. Namely, a position where the flow velocity of the coolant is high tends to be cooled, and a position where the flow velocity of the coolant is low tends not to be cooled. Accordingly, the position at which the flow of the coolant changes is the singular point of the temperature distribution (which may be simply referred to as the singular point, hereinafter).

For example, the position at which the inlet hole 24b1 of the flow channel 24a is formed and the position at which the outlet hole 24c1 of the flow channel 24a is formed, which are shown in FIG. 2, are examples of the singular points. Additionally, the central portion of the flow channel 24a is one of the singular points at which the flow direction of the coolant that enters from the inlet hole 24b1 changes.

A protrusion component is disposed at a singular point or in the vicinity of the singular point in the flow channel 24a for the coolant. In FIG. 2, as examples of the protrusion components, a screw (push screw) 2a for adjusting the flow speed is attached in the vicinity of the inlet hole 24b1 of the flow channel 24a, and a screw (push screw) 2b for adjusting the flow speed is attached in the vicinity of the outlet hole 24c1 of the flow channel 24a. Additionally, a screw 2d is attached in the vicinity of the central portion (an inner end part of the flow channel forming component 5) of the flow channel 24a at which the flow direction of the coolant changes.

A plurality of through holes are formed in the upper surface of the flow channel forming component 5 that forms the flow channel 24a and in the vicinity of the flow channel 24a. The through holes are holes for passing through the gas supply pipe 17 for supplying the heat conductive gas or holes for passing through the lift pins 103. In the vicinity of the through holes, the flow velocity of the coolant rapidly changes, and, thus, the through holes may be singular points.

The through holes 3c, 3e, and 3f are examples of the through holes formed in the flow channel forming component 5 that forms the flow channel 24a. For example, the through hole 3c in the flow channel 24a is located at a position at which the flow of the coolant is changed by the flow channel forming component 5 that is formed in the flow channel 24a. In the embodiment, the screw 2c is attached in the vicinity of a part of the flow channel forming component 5 at which the through hole 3c is formed. The screws 2a through 2c may also be collectively referred to as the screw 2 below. The screw 2 is located at a singular point or in the vicinity of the singular point at which the flow velocity of the coolant in the flow channel 24a rapidly becomes slow or fast.

In addition, for example, at a portion at which the flow channel forming component 5 meanders because of the through hole 3 formed outside the flow channel 24a, if the flow velocity rapidly changes at a corresponding part in the flow channel 24a, the point can be a singular point. In this case, a screw 2 may be arranged at the singular point or in the vicinity of the singular point.

Figure 3A:
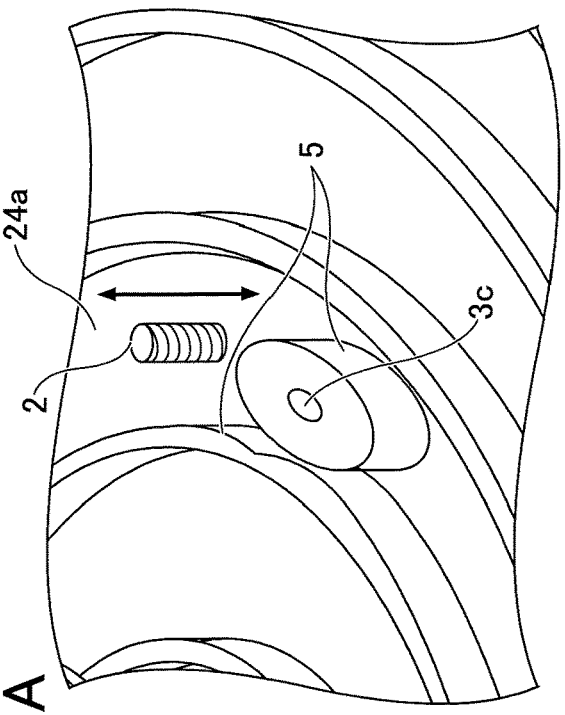
FIG. 3A through FIG. 3D are diagrams illustrating examples of a protrusion component formed in the coolant flow channel according to an embodiment.

FIG. 3A shows an example of the screw 2 arranged in the flow channel 24a. The screw 2 passes through the bottom surface of the flow channel 24a, and the screw 2 is in a state in which the screw 2 protrudes inside the flow channel 24a. By rotating the screw 2, the protruding amount of the screw 2 into the flow channel 24a is adjusted. The screw 2 may be rotated by a hand, or the screw 2 may be automatically rotated by connecting a driver, such as a motor, to the screw 2. As described above, by changing the protruding amount of the screw 2, the flow velocity of the coolant flowing inside the flow channel 24a can be changed, and the singular point of the temperature distribution can be corrected by changing a heat dissipation response property. In particular, according to the embodiment, a design change of the flow channel 24a and the heater 27 is not required, and the singular point of the temperature distribution can be easily corrected.

As described above, the mounting table 20, which includes the base 20a in which the flow channel 24a for the coolant is formed, and the vertically movable screw 2 formed in the flow channel 24a for the coolant, is an example of an assembly provided with a coolant flow channel.

[Flow Channel for the Coolant/Protrusion Component (Baffle Plate)]

Figure 4:
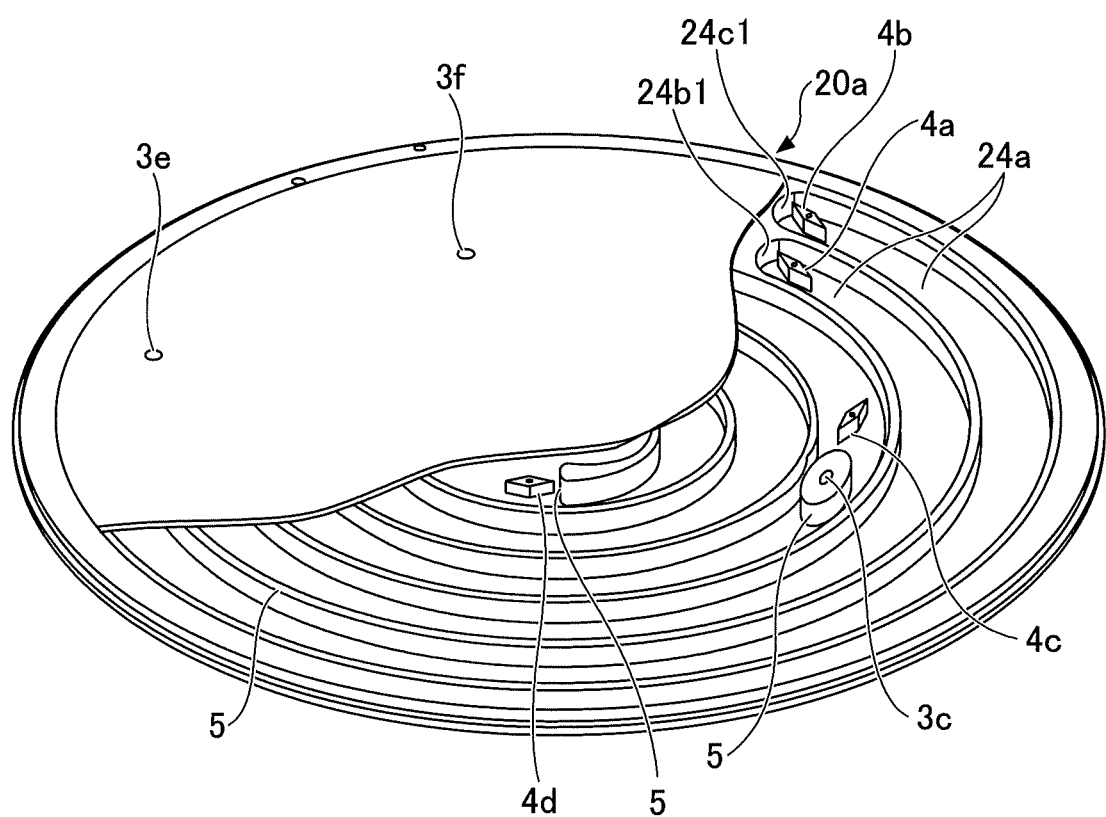
FIG. 4 is a perspective view illustrating an example of the coolant flow channel formed in the mounting table according to an embodiment.

Next, another example of the flow channel 24a for the coolant formed in the mounting table 20 and the protrusion component is described by referring to FIG. 4. FIG. 4 is a perspective view illustrating an example of the flow channel 24a for the coolant, which is formed in the mounting table 20 according to an embodiment. In FIG. 4, a case is illustrated in which the protrusion component is a baffle plate 4.

In the flow channel 24a for the coolant illustrated in FIG. 4, as examples of the protrusion components, a baffle plate 4a for adjusting the flow velocity is attached in the vicinity of the inlet hole 24b1 and a baffle plate 4b for adjusting the flow velocity is attached in the vicinity of the outlet hole 24c1. Additionally, a baffle plate 4d is attached in the vicinity of the central portion of the flow channel 24a (the inner end portion of the flow channel forming component 5) at which the direction of the flow of the coolant changes. Additionally, a baffle plate 4c is attached in the vicinity of a part of the flow channel forming component 5 at which the through hole 3c is formed. In the following, the baffle plates 4a through 4d may be collectively referred to as the baffle plate 4. The baffle plate 4 is disposed at a singular point or in the vicinity of the singular point at which the coolant inside the flow channel 24a stays and the flow velocity of the coolant becomes rapidly slow of fast. For example, the baffle plate 4 may be attached in the vicinity of the inner end portion of the flow channel 24a at the central portion of the flow channel 24a at which the direction of the flow of the coolant changes.

Figure 3B:
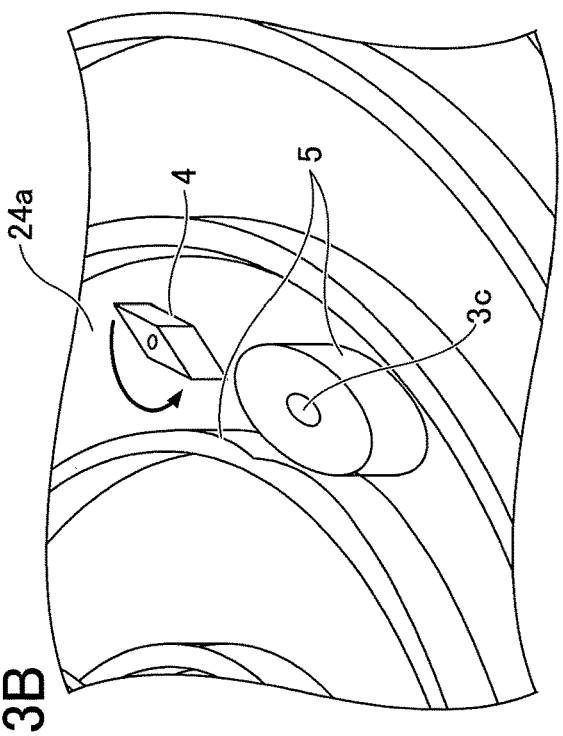

FIG. 3B illustrates an example of the baffle plate 4 disposed inside the flow channel 24a. The baffle plate 4 is provided in the flow channel 24, and the baffle plate 4 is rotatable by a rotation shaft that passes through the bottom surface of the flow channel 24a from the center of the baffle plate 4. By rotating the rotation shaft, the angle of the baffle plate 4 is adjusted, and thereby the flow velocity of the coolant inside the flow channel 24a is adjusted. The rotation of the baffle plate 4 may be manually controlled, or the rotation of the baffle plate 4 may be automatically controlled by connecting a driver, such as a motor, to the rotation shaft of the baffle plate 4. As described above, by changing the angle of the baffle plate 4, the flow velocity of the coolant flowing inside the flow channel 24a can be changed. By changing the heat dissipation response property, the singular point of the temperature distribution can be corrected.

As described above, the mounting table 20, which includes the base 20a in which the flow channel 24a for the coolant is formed, and the rotatable baffle plate 4 formed in the flow channel 24a for the coolant, is an example of an assembly provided with a coolant flow channel.

Note that, the flow channel 24a for the coolant illustrated in FIG. 2 may be formed inside the base 20a by bonding, to the base 20a, the flow channel forming component 5 in which the flow channel 24a is formed. Further, the flow channel 24a for the coolant may be formed by a 3D printer based on 3D data for the flow channel for the coolant, which is read by the 3D printer, for example.

Here, the screw 2 may be disposed prior to bonding the upper part of the base 20a to the flow channel forming component 5 of the base 20a, or the screw may be disposed after bonding the upper part of the base 20a to the flow channel forming component 5 of the base 20a. The baffle plate 4 is disposed prior to bonding the upper part of the base 20a to the flow channel forming component 5.

Modified Example 1

Figure 3C:
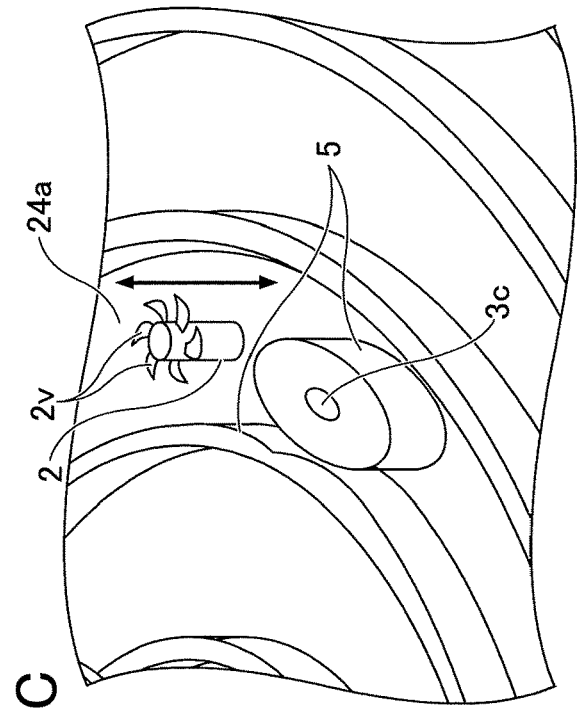
Figure 3D:
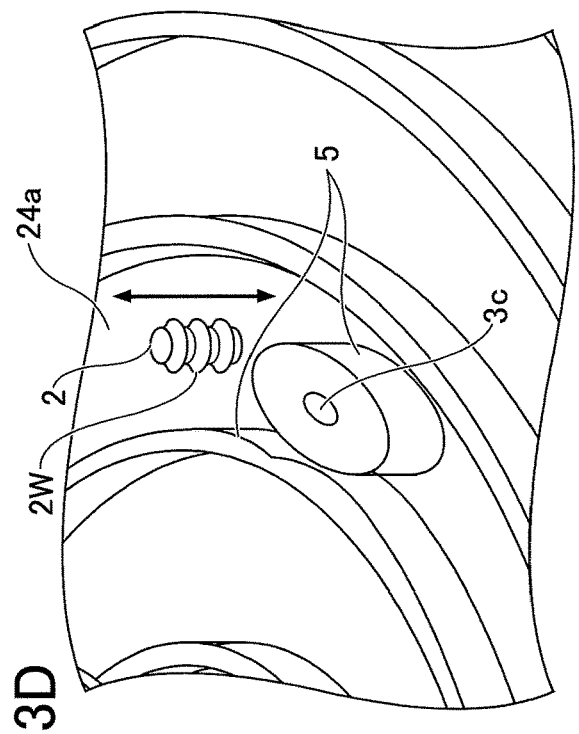

The surfaces of the screw 2 and the baffle plate 4, which are examples of the protrusion component, may be machine processed so as to increase the surface area. For example, FIG. 3C illustrates, as a modified example of the protrusion component, an example of a configuration such that a fin 2V is attached to the screw 2. FIG. 3D illustrates, as a modified example of the protrusion component, an example of a configuration such that concave and convex 2w are formed in the screw 2.

However, the protrusion component is not limited to the protrusion component according to the above-described modified example. For example, a groove or a hole may be formed in the screw 2 or the baffle plate 4; the shapes of the screw 2 and the baffle plate 4 may be bent; or the shapes of the screw 2 and the baffle plate 4 may conical shapes and/or polygonal shapes. Furthermore, the protrusion component is a vertically movable or rotatable component. As described above, by forming the shape of the protrusion component so as to disturb the flow of the coolant, the flow velocity of the coolant flowing inside the flow channel 24a can be changed, and by changing the heat dissipation response property, the singular point of the temperature distribution can be corrected.

Modified Example 2

The assembly including the flow channel for the coolant is described above by exemplifying the mounting table 20 including the base 20a and the protrusion component (the screw 2, the baffle plate 4). In the example 1 illustrated in FIG. 1, the assembly including the flow channel for the coolant further includes a mounting surface that is formed adjacent to the base 20a and that is for mounting the wafer W; and the electrostatic chuck 21 for electrostatically attracting the wafer W.

The assembly provided with the flow channel for the coolant may be, for example, the gas shower head 40 that functions as the upper electrode illustrated in FIG. 1. The gas shower head 40 includes the top plate 40b (a plate shaped component) that is provided adjacent to the main body 40a (base) and that functions as an electrode. In the top plate 40b, the flow channel 42a for the coolant is formed. In the flow channel 42a for the coolant, similar to the flow channel 24a for the coolant, a screw or a baffle plate, as the protrusion component, is provided at a singular point in the flow channel 42a for the coolant. As a result, the flow velocity of the coolant flowing inside the flow channel 42a can be changed, and by changing the heat dissipation response property, the singular point of the temperature distribution can be corrected.

Additionally, the assembly provided with the flow channel for the coolant according to the embodiment may be installed at a part desired to be cooled by the flow channel in the substrate processing apparatus 1, such as a part at which heat caused by plasma enters when the wafer W is processed.

Modified Example 3

The screw 2 and the baffle plate 4 may pass through the flow channel 24a from the bottom side of the flow channel, may pass through the flow channel 24a from the ceiling surface side of the flow channel, or may pass through the flow channel 24a from the side surface of the flow channel. Similarly, the screw 2 and the baffle plate 4 may pass through the flow channel 42a from the bottom side of the flow channel, may pass through the flow channel 42a from the ceiling surface side of the flow channel, or may pass through the flow channel 42a from the side surface of the flow channel.

Modified Example 4

The flow channel 24a may not be formed in the spiral shape. Similarly, the flow channel 42a may not be formed in the spiral shape. As another example of the flow channel 24a or the flow channel 42a, there is an example in which circular flow channels are concentrically provided. In such a case, a through hole, an inlet hole and an outlet hole of the coolant, or a meandering flow channel part formed in the flow channel 24a or the flow channel 42a may become singular points. Accordingly, by providing one or more protrusion components at a singular point or in the vicinity of the singular point, the flowing velocity of the coolant flowing in the flow channel 24a or the flow channel 42a can be changed, and by changing the heat dissipation response property, the singular point of the temperature distribution can be corrected.

[Method of Controlling the Assembly Provided with the Flow Channel for the Coolant]

Next, a method of controlling the assembly provided with the flow channel for the coolant according to the embodiment is described by referring to FIG. 5 and FIG. 6. FIG. 5 is a flow chart illustrating an example of a control process by the assembly provided with the flow channel for the coolant according to the embodiment. FIG. 6 illustrates an example of a table used for the control process by the assembly provided with the flow channel for the coolant according to the embodiment.

In the control process illustrated in FIG. 5, a case is exemplified in which temperature control of the mounting table 20 is executed using the flow channel 24a of the coolant and the heater 27. When the set temperature of the heater 27 and the set temperature of the coolant in the chiller unit 105 are determined, the electric power to be output from the heater 27 is determined. Accordingly, by vertically moving the screw 2 in response to the electric power output from the heater 27, or by rotating the rotation shaft of the baffle plate 4 to change the angle of the baffle plate 4 in response to the electric power output from the heater 27, the flow velocity of the coolant flowing inside the flow channel 24a can be changed, and the singular point of the temperature distribution can be corrected.

In the table of FIG. 6, data (backup data) is recorded, in which the electric power output form the heater 27 and the height of the screw 2 are associated in advance. The table may be stored in the memory of the controller 100.

In response to detecting that the process is started, the controller 100 supplies the coolant at a predetermined set temperature from the chiller unit 105 to the flow channel 24a (step S10). Subsequently, the controller 100 supplies predetermined electric power from the alternating current power supply 106 to the heater 27 (step S12).

Subsequently, the controller 100 performs control to vertically moving the screw 2 provided in the flow channel 24a for the coolant depending on the value of the predetermined electric power supplied to the heater 27 (step S14), and the controller 100 terminates the process. At step S14, the controller 100 vertically moves the screw 2 in accordance with the table of FIG. 6, so that the height of the screw 2 corresponds to the electric power supplied to the heater 27.

As described above, the method of controlling the assembly provided with the flow channel for the coolant according to the embodiment is for executing a process of supplying the coolant at a predetermined temperature to the flow channel 24a for the coolant; a process of supplying the predetermined electric power to the heater 27; and a process of controlling vertical movement of the screw 2 in response to the electric power supplied to the heater 27, in the mounting table 20 including the base 20a in which the flow channel 24a for the coolant is formed, the screw 2 disposed in the flow channel 24a for the coolant, the heater 27, and the flow channel 24a for the coolant.

Alternatively, the method of controlling the assembly provided with the flow channel for the coolant according to the embodiment may execute, in the mounting table 20, a process of supplying the coolant at a predetermined temperature to the flow channel 24a for the coolant; a process of supplying the predetermined electric power to the heater 27; and a process of controlling the angle of the baffle plate 4 in response to the electric power supplied to the heater 27.

According to this, when the screw 2 is raised, or when the angle of the baffle plate 4 is changed in a direction to narrow the flow channel 24a, the conductance of the coolant is lowered at the position at which the screw 2 or the baffle plate 4 is located, the flow velocity of the coolant increases, and the cooling effect at the location is enhanced. As a result, the flow velocity of the coolant flowing in the flow channel 42a can be changed, and, by changing the heat dissipation response property, the singular point of the temperature distribution can be corrected.

The embodiment is described by the example in which control of the movement of the protrusion component is executed based on the electric power supplied to the heater 27. However, embodiments are not limited to this. For example, in the control of the movement of the protrusion component, the height of the screw 2 may be determined depending on a process condition, such as the RF electric power output from the first RF power supply 32 and the RF electric power output from the second RF power supply 34. Additionally, in the control of the movement of the protrusion component, the height of the screw 2 may be determined depending on the density of the plasma measured by a measuring device, such as a Langmuir probe. Additionally, the height of the screw 2 may be determined depending on at least one of the electric power supplied to the heater 27; the process condition, such as the RF power; and the density of the plasma. Furthermore, depending on the type of the coolant or the flow velocity of the coolant, the control of the movement of the protrusion component may be corrected.

Furthermore, the method of controlling the assembly provided with the flow channel for the coolant according to the embodiment may preferably be executed in real time in response to the density of the plasma in the process and the electric power supplied to the heater.

As described above, according to the substrate processing apparatus 1 according to the embodiment, a correction can be made to achieve uniformity of the temperature of the substrate without redesigning the mounting table.

The assembly provided with the flow channel for the coolant, the method of controlling the assembly provided with the flow channel for the coolant, and the substrate processing apparatus are described above by the above-described embodiments. However, the assembly provided with the flow channel for the coolant, the method of controlling the assembly provided with the flow channel for the coolant, and the substrate processing apparatus according to the present invention are not limited to the above-described embodiment, and various modifications and improvements may be made within the scope of the present invention. The items described in the plurality of embodiments may be combined, provided that the items do not contradict.

The substrate processing apparatus according to the present invention can be applied to any one type of the capacitively coupled plasma (CCP), the inductively coupled plasma (ICP), the radial line slot antenna, the electron cyclotron resonance plasma (ECR), and the helicon wave plasma (HWP).

In this specification, the wafer W is described as an example of the substrate. However, the substrate is not limited to the wafer W. The substrate may be a substrate used for a liquid crystal display (LCD) or a flat panel display (FPD); a photomask; a CD substrate; a printed board, etc.

What is claimed is:

1. An assembly comprising:
a coolant flow channel having a spiral shape;
a base in which the coolant flow channel is formed;
a protrusion component that is disposed in the flow channel, wherein the protrusion component is liftable,
a heater; and
a controller that controls vertical movement of the protrusion component,
wherein an inlet hole through which the coolant enters and an outlet hole from which the coolant exits are formed in the coolant flow channel,
wherein a single cross section includes a center point of the spiral shape, a cross section of the entire coolant flow channel from the inlet hole to the outlet hole, and a cross section of the protrusion component,
wherein the flow channel is formed of a flow channel forming component, and the flow channel forming component includes an elliptical protrusion that forms a through hole passing through the flow channel without contacting the flow channel, and
wherein the controller stores a table that defines correspondence between a plurality of intermediate values of electric power supplied to the heater and a respective plurality of intermediate values of height of the protrusion component, each of the plurality of intermediate values being in a range between a zero power level and a maximum power level, and the controller controls the vertical movement of the protrusion component in accordance with the table, in response to detecting a value of the electric power supplied to the heater.

2. The assembly according to claim 1, wherein the protrusion component is disposed at a singular point of a temperature distribution in the coolant flow channel.

3. The assembly according to claim 1,
wherein the protrusion component includes, a first protrusion component and a second protrusion component, and the inlet hole and the outlet hole are singular points of a temperature distribution in the coolant flow channel, and,
wherein the first protrusion component is disposed in a vicinity of the inlet hole, and the second protrusion component is disposed in a vicinity of the outlet hole.

4. The assembly according to claim 1,
wherein a central portion of the coolant flow channel is a singular point of a temperature distribution in the coolant now channel at which a direction of a flow of the coolant changes, and the protrusion component is disposed at the singular point or in a vicinity of the singular point.

5. The assembly according to claim 1, wherein another through hole is formed in the coolant flow channel, and wherein the through hole is a singular point of a temperature distribution in the coolant flow channel, and the protrusion component is disposed in a vicinity of the singular point.

6. The assembly according to claim 1, wherein the protrusion component is a screw or a baffle plate.

7. The assembly according to claim 1, wherein the assembly provided with the coolant flow channel includes a mounting surface and an electrostatic chuck,
wherein the mounting surface is disposed adjacent to the base, and an object to be processed is placed on the mounting surface, and
wherein the electrostatic chuck electrostatically attracts the object to be processed.

8. The assembly according to claim 1, wherein the assembly provided with the coolant flow channel includes a plate shaped component disposed adjacent to the base, wherein the plate shaped component functions as an electrode.

9. A substrate processing apparatus comprising:
a mounting table disposed in a processing container, wherein an object to be processed is placed on the mounting table;
an upper electrode disposed to face the mounting table; and
an assembly provided with a coolant flow channel having a spiral shape,
wherein the assembly provided with the coolant flow channel includes a base in which the coolant flow channel is formed, a protruding component disposed in the coolant flow channel, the protruding component being liftable, a heater, and a controller that controls vertical movement of the protrusion component,
wherein an inlet hole through which the coolant enters and an outlet hole from which the coolant exits are formed in the coolant flow channel,
wherein a single cross section includes a center point of the spiral shape, a cross section of the entire coolant flow channel from the inlet hole to the outlet hole, and a cross section of the protrusion component,
wherein the flow channel is formed of a low channel forming component, and the flow channel forming component includes an elliptical protrusion that forms a through hole passing through the flow channel without contacting the flow channel,
wherein the controller stores a table that defines correspondence between a plurality of intermediate values of electric power supplied to the heater and a respective plurality of intermediate values of height of the protrusion component, each of the plurality of intermediate values being in a range between a zero power level and a maximum power level, and the controller controls the vertical movement of the protrusion component in accordance with the table, in response to detecting a value of the electric power supplied to the heater, and
wherein the assembly provided with the coolant flow channel is disposed in at least one of the mounting table and the upper electrode.

10. A method of controlling an assembly provided with a coolant flow channel,
wherein the coolant flow channel has a spiral shape, and the assembly provided with the coolant flow channel includes a base in which the coolant flow channel is formed, a protrusion component disposed in the coolant flow channel, the protrusion component being liftable, a heater, and a controller that stores a table that defines correspondence between a plurality of intermediate values of electric power supplied to the heater and a respective plurality of intermediate values of height of the protrusion component, each of the plurality of intermediate values being in a range between a zero power level and a maximum power level, and that controls vertical movement of the protrusion component, wherein an inlet hole through which the coolant enters and an outlet hole from which the coolant exits are formed in the coolant flow channel, wherein a single cross section includes a center point of the spiral shape a cross section of the entire coolant flow channel from the inlet hole to the outlet hole, and a cross section of the protrusion component, wherein the flow channel is formed of a flow channel forming component, and the flow channel forming component includes an elliptical protrusion that forms a through hole passing through the flow channel without contacting the flow channel, and wherein the method includes supplying the coolant at a predetermined temperature to the coolant flow channel, supplying predetermined electric power to the heater, and controlling the vertical movement of the protrusion component in accordance with the table, in response to detecting a value of the electric power supplied to the heater.

* * * * *